United States Patent [19]

Morris

[11] Patent Number: 4,903,631
[45] Date of Patent: Feb. 27, 1990

[54] SYSTEM FOR SOLDERING PRINTED CIRCUITS

[75] Inventor: Gilbert V. Morris, Amherst, N.H.

[73] Assignee: Teledyne Industries, Inc., Los Angeles, Calif.

[21] Appl. No.: 199,604

[22] Filed: May 27, 1988

[51] Int. Cl.⁴ .................................................. B05C 1/02
[52] U.S. Cl. ........................................ 118/63; 118/69; 118/74; 118/600; 118/602
[58] Field of Search .................... 228/33, 34, 37, 36, 228/38, 40, 43, 46, 47, 200; 118/69, 403, 63, 422, 424, 600, 602, 74, 603

[56] References Cited

U.S. PATENT DOCUMENTS

| | | | |
|---|---|---|---|
| 3,053,215 | 9/1962 | Guty | 118/422 |
| 3,058,441 | 10/1962 | Walker et al. | 118/403 |
| 3,190,527 | 6/1965 | Tardoskegyi | 118/403 |
| 3,386,166 | 6/1968 | Tardoskegyi | 228/37 |
| 3,435,801 | 4/1969 | Carini et al. | 118/63 |
| 3,603,646 | 9/1971 | Leoff | 406/89 |
| 3,724,418 | 4/1973 | McLain | 228/37 |
| 3,744,557 | 7/1973 | Costello | 228/47 |
| 3,980,219 | 9/1976 | Schmid | 228/34 |
| 4,277,518 | 7/1981 | Schilke et al. | 118/69 |
| 4,383,494 | 5/1983 | Schillke et al. | 118/50 |
| 4,563,974 | 1/1986 | Price | 118/69 |
| 4,608,941 | 9/1986 | Morris | 118/424 |
| 4,709,846 | 12/1987 | Eldenberg | 228/34 |

FOREIGN PATENT DOCUMENTS

| | | | |
|---|---|---|---|
| 2856460 | 12/1978 | Fed. Rep. of Germany | |
| 2205254 | 9/1987 | Japan | 118/424 |
| 1362695 | 12/1957 | U.S.S.R. | 406/88 |

Primary Examiner—Willard Hoag
Attorney, Agent, or Firm—Hayes, Soloway, Hennessey & Hage

[57] ABSTRACT

A system for soldering, leveling and cooling printed circuit panels including a preheater, a fluxer, and soldering, leveling and cooling stations. The cooperation of the soldering, leveling and cooling stations provides for efficient processing of printed circuit panels. The soldering station, which includes a solder immersion chamber through which the panels are conveyed, provides an oil coating on the solder to minimize formation of dross. Automatic replenishment of oil through use of suitable flux on the panels to be soldered provide continuous cleaning of the soldering system to permit extended operation. A cooling table transports the soldered panels on a cushion of air to prevent marring.

7 Claims, 7 Drawing Sheets

SYSTEM FOR SOLDERING PRINTED CIRCUITS

BACKGROUND OF THE INVENTION

Printed circuits widely used in electronics and electrical devices, are formed with major dimensions of length and width and contain one or more circuits. The thickness of the printed circuit panels varies for many different reasons and directly affects panel flexibility, i.e., there are rigid and flexible circuit boards.

For example, printed circuits with multiple conductor planes use a bonded dielectric layer or layers for separation. Holes perforated through the circuit substrate serve a number of purposes including solder terminals for installation into another assembly, plated through hole interconnections between conductor planes and tooling registration holes.

Exposed copper on the finished printed circuit panels must, with few exceptions, be solder coated, a process sometimes termed presoldering or soldering. It is preferable that the solder coating be applied only where needed later and not on all conductor runs. To apply solder selectively, a dielectric, referred to as a cover dielectric or solder mask, is used to cover copper, the normally used conductor, that need not be solder coated. Thus desired copper portions remain exposed and are solder coated, including terminal pads and the like. In other words the exposed copper on the surface or surfaces of the printed circuit must be effectively solder coated.

It is also necessary that all holes through the printed circuit be lined with solder but unobstructed by solder when finished so as not to obstruct later insertion requirements. The process of removing excess surface solder and clearing the holes of solder, after solder coating the surface conductors, is referred to as solder leveling or leveling.

In other words, printed circuit panels are soldered, inter alia, to maintain solderability for subsequent operations. For economic purposes, such soldering should be accomplished as a mass panel coating technique and should provide even coatings on the surfaces and in holes without surface flaws.

An improved apparatus for soldering printed circuit panels disclosed in my U.S. Pat. No. 4,608,941 for "Apparatus for Soldering Printed Circuit Panels" includes a roll configuration to convey the panels horizontally across a container of molten solder. Immersion of the circuit panels in flowing solder is followed by subjecting the panels to suitably positioned air knives for leveling the solder on the panels.

While the patented apparatus has provided significant advantages for soldering printed circuit panels, there remained the need for a soldering system that improves the speed and reliability of soldering printed circuit panels, and that can be operated over extended time periods with improved removal of dross and other impurities from the soldering system.

Moreover, following soldering and leveling of the printed circuit panels, the prior apparatus engaged and tended to disturb the still hot and unsolidified solder on the lower side of the printed circuit panels. It would be advantageous to convey the panels through a cooling system to solidify the solder without tracking or marring the wet soldered surfaces.

SUMMARY OF THE INVENTION

The present invention provides a system for effectively soldering, leveling and cooling printed circuit panels at relatively high speeds in a continuous manner. More particularly, a preheating station is provided to elevate the temperature of the panels to a desired value, and a fluxing station then coats the panels with a suitable flux that has an added benefit of supplying oil to an oil blanket on the molten solder. Conveying rolls transport the panels through these stations to an improved soldering station, including at least one solder immersion chamber defined by upper and lower guides and two pairs of rolls adapted to convey printed circuit panels through the chamber. A manifold below the chamber flooded with solder functions to supply solder through the lower guides to fill the solder chamber. Vertical manifolds close the ends of the immersion chamber and provide an additional vertical flow path to carry solder up and around panels passing through the chamber to insure a full solder chamber. The lower guide or retainer includes lips positioned closely to the surface of the lower rolls to prevent excessive leakage of solder from the chamber before and as the rolls convey the panels through the molten solder.

A unique solder flow path and solder levels enable all molten solder to be oil covered during hot idling of the system. During soldering of circuit panels, the system uses three levels of solder and provides for automatic disposal of impurities, including dross formed by exposure of solder to air, by adding to the coating oil, flux oil washed off the panels during the soldering process.

After being solder coated, the panels are conveyed to a solder leveling station including upper and lower air knives to level the molten solder on the panels by removing excess solder and clearing holes through the panels. Such leveling is done close to the panel's exit from the solder immersion chamber before the solder can start to solidify. Moreover, excess solder from the panels is blown back to the output rolls and returned via a solder flow path to the sump of the soldering system.

From the leveling station, the panels are transported to a cooling station comprising an air transport table provided with a perforated surface through which cooling air flows to support the panels on a cushion of air. The panels are then conveyed under a further flow of air to cool their upper surfaces.

Using the inventive system, a wide variety of printed circuit panels, both flexible and rigid, and of various sizes and thicknesses, can be soldered on both sides rapidly without subjecting the substrate of the panels to elevated solder temperatures for more than a brief interval. The system can be operated over extended periods without the need for shut downs to attend to cleaning. Moreover, the cooling air table functions to solidify the solder without tracking and marring the soldered conductor surfaces.

DESCRIPTION OF EXEMPLARY EMBODIMENTS

Figure 1A:
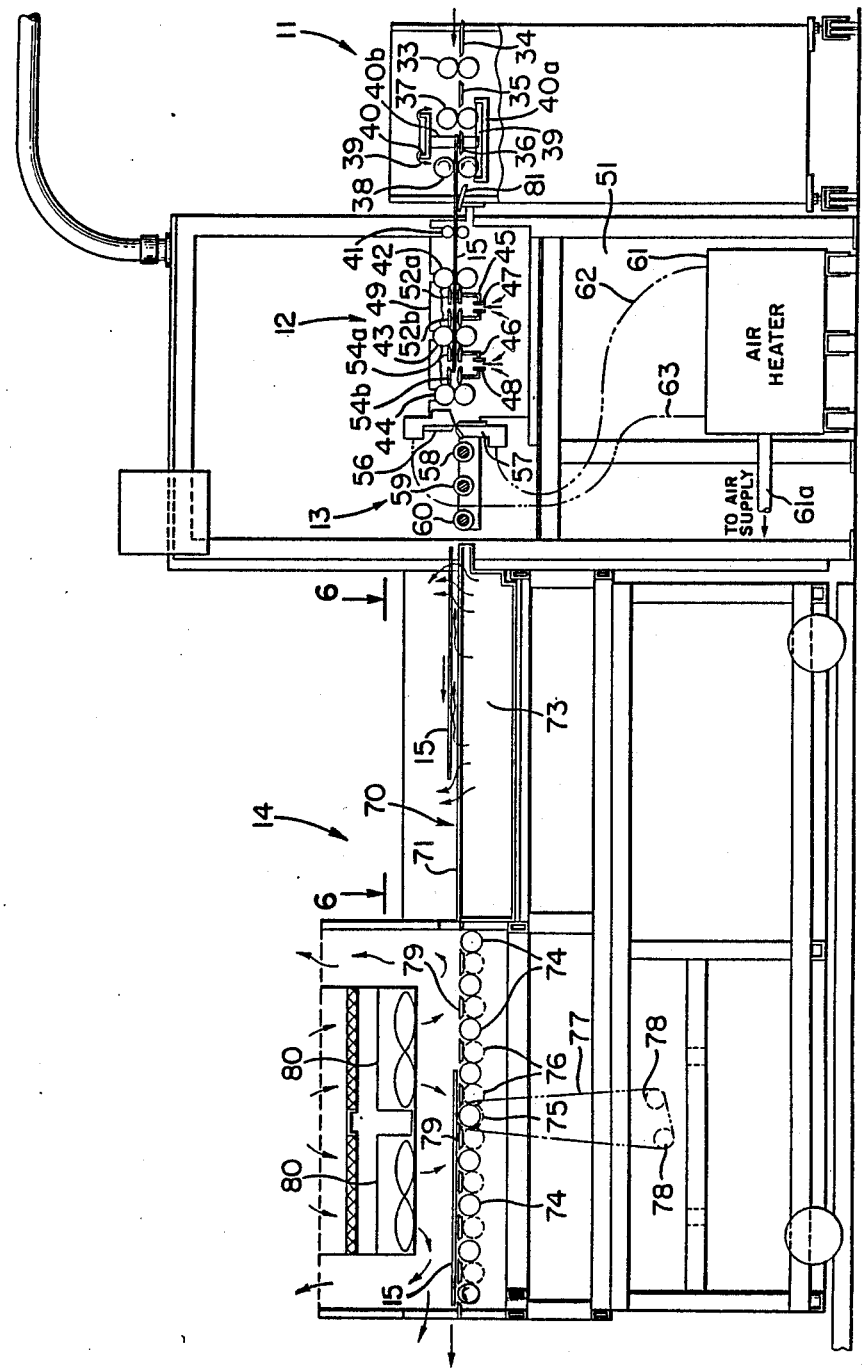
FIGS. 1A and 1B combine to provide a front view, partially broken away, showing diagrammatically the entire soldering system of the present invention.
Figure 1B:
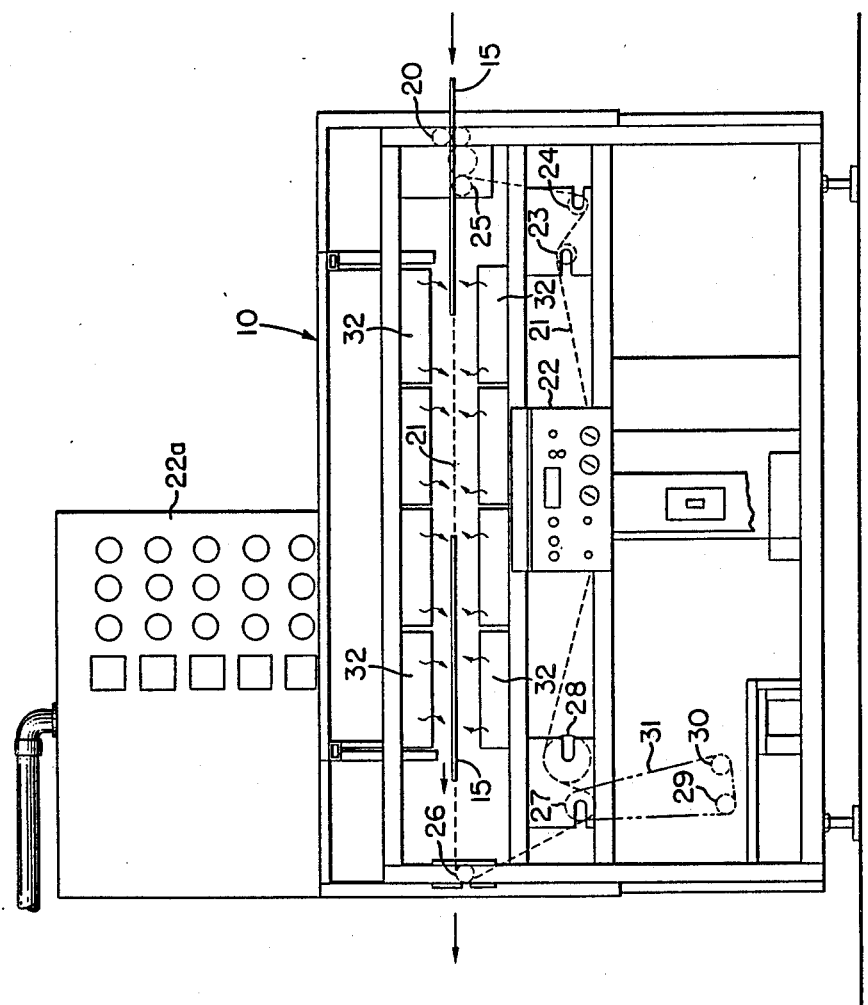

Referring to the invention in greater detail with reference to FIGS. 1A and 1B which together show the soldering system, a preheater 10, a fluxer 11, a solder station 12, a solder leveling station 13 and a cooling station 14 are arranged to receive and process printed circuit panels 15.

The preheater 10 includes input rolls 20 which, when the panels 15 are fed thereto, transport them to a suitable open conveyer belt 21, for example a stainless steel wire belt to enable exposure of the lower panel surfaces, as well as their upper surfaces, to infrared radiation. The conveyor is driven along a path including guide rolls 23, 24, 25, 26 and 28. Suitably driven rolls 29 and 30 are connected by one or more belts 31 to a drive pulley 27. Idler rolls 20a at each end of the roll 25 drive the input rolls 20. Modules 22 and 22a include various control switches and indicators for the system.

Diagrammatically shown infrared heating elements 32 are located above and below the conveyor 21 to preheat panels 15 as they pass through the preheater 10. In an exemplary embodiment of the system, the panels 15 are conveyed through the preheater 10 at speeds on the order of 6 inches per second, and exit from the preheat roll 26 at a surface temperature on the order of 250° to 300° F., as discussed in greater detail hereinafter.

The panels 15 enter the fluxer 11 at entry rolls 33 for conveying the heated printed circuits along plates 34, 35 and 36 and through pairs of fluxing rolls 37 and 38 having soft fibrous and absorbent surfaces. As diagrammatically shown, a suitable soldering flux 39, described hereinafter, is supplied in appropriate quantities to rolls 37 and 38 to coat the panels 15 as they pass through the fluxer. For example, an appropriate pump provided in the fluxer, which holds a quantity of flux in a container, pumps the flux through suitable piping to a distribution manifold 40 diagrammatically shown above the rolls 37 and 38 for spilling the flux onto the rolls 37 and 38 for transfer to the heated panels 15. A container 40a below the rolls 37 and 38 is filled with flux via an outlet 40b, located at one end of the rolls, from the manifold 40. The container 40a also receives flux from the manifold 40 flow to the rolls. Thus the coating rolls 37 and 38 receive the flux from both the manifold 40 and the container 40a.

The soldering station 12, shown in FIG. 1A, and in more detail in FIGS. 2-5, includes suitably driven rolls 41 to receive the panels 15 from the fluxer 11 and convey them to pairs of rolls 42, 43 and 44. The lower driven rolls 42-44 are fixed while the upper rolls are mounted to enable vertical movement to accommodate panels 15 of varying thickness.

Disposed beneath, between and parallel to the rolls 42, 43 and 44 are manifolds 45 and 46 to receive solder pumped into the manifolds through inlet pipes 47 and 48, as shown by the arrows in FIG. 1A, by a suitable pump 118 and passage 120 from a heated solder container 116 into which the solder is recycled through return channels, as explained in more detail hereinafter.

Suitably beveled retainer guides 52a-52b, 53a-53b, 54a-54b and 55a-55b retain solder in solder immersion chambers 82 and 83 (FIG. 5) and help guide panels 15 therethrough, as discussed in detail hereinafter.

Figure 2:
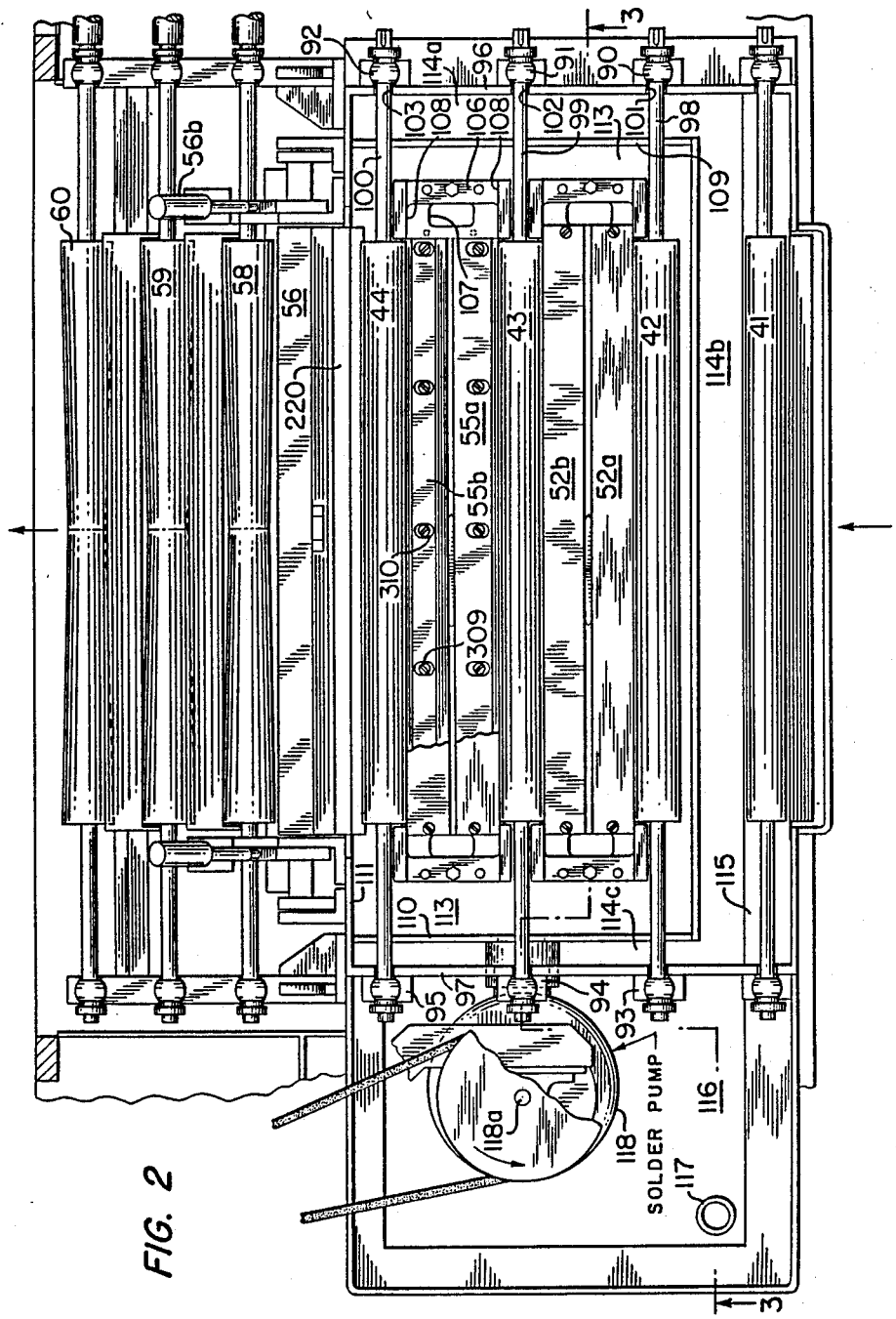
FIG. 2 is a plan view of the soldering and leveling stations of FIG. 1A.

The panels are then conveyed to the solder leveling station 13 which includes upper and lower air knives 56 and 57 and tapered rolls 58, 59 and 60 suitably coupled to drive means, as diagrammatically shown in FIG. 2. Air heater 61 is supplied from an external air supply through hose 61a to furnish compressed air through diagrammatically shown air lines 62 and 63 to the upper and lower air knives 56 and 57, respectively. Holes through the panel are effectively cleared of solder by the air knives, and excess solder is stripped from the surface and the solder leveled on the conductive portions of the printed circuit panels 15. Solder removed from the panels 15 returns to the solder sump through the solder skim section and return flow, an important feature of the invention as discussed hereinafter.

Solder leveler conveying rolls 58, 59 and 60 are double tapered from their outer edges to a smaller diameter at their center lines, as best shown in FIG. 2, so that the panels 15, which have just been soldered and leveled, are engaged at their edges by the tapered rolls, hence the still liquid solder is not disturbed and tracked.

Figure 6:
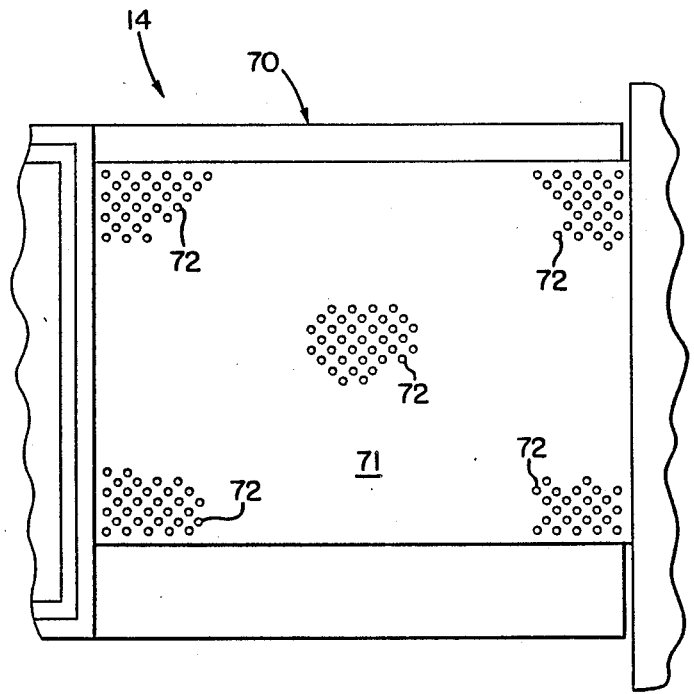
FIG. 6 is a plan view, partially broken away, of the cooling air table shown in FIG. 1A.

The panels 15 are conveyed by the tapered rolls to the cooler 14 which includes an air table 70 slightly tilted so that its input is above its output. For example, with a 36 inch long table, the input end can be 0.5 inches higher than the output to convey the panels at a desired speed. As shown in FIGS. 1A and 6, perforations 72 provided over the entire surface 71 of the table 70, supply cooled air to the panels 15 from a suitable air pump (not shown) supplying pressurized air to an air manifold 73 under the perforated surface 71. The panels 15 delivered to the cooler 14 float on an air cushion above the table and are cooled as they are conveyed across the table. The integrity of the molten solder on the panel conductors is not impaired by contact with any conveying device until the solder has been solidified.

As the panels 15 float from the air table 70, they are conveyed by suitably tapered rolls 74, similar in configuration to the rolls 58-60. The rolls 74 are driven at their ends by a drive gear 75, which engages driven gears 76 between the tapered conveyer rolls 74. Suitable belts 77 driven by pulleys or gears 78 rotate the drive gear 75 at a desired speed. Guide plates 79 are also provided between the rolls 74 to facilitate conveyance of the soldered panels 15. Diagrammatically shown cooling fans 80 flow air downwardly onto the upper surface of the panels 15 to cool the upper soldered surfaces. The cooled and soldered panels 15 are then conveyed out of the cooler 14 as finished soldered printed circuits.

Referring to the solder station 12 in greater detail with reference to FIGS. 2-5, the rolls are journaled by suitable spherical bearings 90-92 supported by bearing blocks 93-95 attached to plates 96 and 97 forming walls of the solder tank system. An exemplary material used for the rolls 42-44 is gray cast iron which is not wetted by the solder. However, other materials can be used including those wetted by solder. Roll shafts 98-100 respectively extending from the rolls 42-44, pass through slots 101-103 in the plates 96 and 97. Grease discs 104 between the spherical bearings at the end of each roll provide suitable lubrication. Compression springs 105 between the upper and lower bearings in the bearing blocks partially counterbalance the weight of the upper rolls 42, 43 and 44. When the panels are fed to the roll nips, the upper rolls move upwardly in the slots 101–103, aided by the counterbalancing springs 105.

The lower distribution manifolds 45 and 46 support vertical manifolds 106 at each of their ends and adjacent to the ends of the rolls 42–44 to enclose the solder immersion chambers 82 and 83. Vertical openings 107 in the manifolds 106 communicate with two upper level flow paths. The first flow path extends from between retaining walls 108 along the upper surfaces of the guides 52a, 52b and 54a, 54b. The second flow path extends from between the retaining walls 108 to the outer edge of the upper surface of each manifold 106.

The lower panel guides 53a and 53b, supported by the manifold 45, also function as retainers for solder in the solder immersion chamber 82. Lips 53c on the ends of the retainers are positioned close to the rolls 42 and 43, for example spaced 0.005 to 0.015 inch at the ends of the rolls, by means of mounting screws 309 and slots 310 in the lower guides (FIG. 2 shows guides 55a–55b). Lips 55c perform a similar function in the chamber 83. Preferably the rolls are slightly tapered toward their centers so that the clearance will be a bit greater at the center. Such tapering eases the strain on the panels 15 and tends to maintain them on a central path during conveyance through the solder immersion chambers 82 and 83.

Walls 109 and 110 at each end of the rolls extend between higher walls 111 and 112, all of which define a constant level skim section 113 normally filled with solder at a level around and below the solder immersion chambers 82 and 83.

The upper guides or solder retainers 52a, 52b and 54a, 54b, are supported by the vertical manifolds 106 with their upper surfaces forming a flow path for solder. Thus solder flooding the chambers 82 and 83 rises through openings between the upper guides and flows parallel to the rolls 42–44 to join with flow from passages 107 of the vertical manifolds 106 to overflow into the constant level skim section 113. When a printed circuit panel is conveyed into the chamber 82, there is solder leakage flow from the chamber through the parted rolls 42 and 43. In addition, the wider the panel in the chamber 82, the more interference with the upward flow of solder in the chamber. However, solder flow upwardly in the manifold passages 107 bypasses the panel, flows along the guides 52a and 52b and downwardly between the guides, thereby maintaining the chamber 82 full of solder and insuring complete immersion of the panel in the solder. It is apparent that the upper guides 52a and 52b could be formed by a single plate and spaced from the rolls to permit solder flow between the upper guide and the rolls.

If desired, the openings between the lower retainers 53a, 53b and 55a, 55b can be enlarged toward each side of the rolls 42–44 to enable additional solder flow to bypass wide panels in the chambers 82 and 83, thereby maintaining the chambers full for complete solder immersion of the panels. Such enlarged openings can supplement or replace the vertical passages 107.

Solder return passages 114a, 114b and 114c are formed by the areas between the walls 96 and 109, the wall 112 and a wall 115 at the input side of the soldering station, and the walls 110 and 97 at the left side (FIG. 2) of the rolls.

The solder return passages lead to a solder container or sump 116 at the left side of the soldering station (FIG. 2), holding the heated molten solder. Electric resistance heaters (not shown) are clamped externally on the sump 116 and to appropriate portions of the soldering station to maintain the molten solder at a suitable temperature, for example 490° F. A preferred solder is a eutectic solder composed of 63% tin and 37% lead (Sn63 Pb37).

An overflow outlet pipe 117 extends upwardly through the floor of the sump 116 to a horizontal level slightly above the level of the top of walls 109 and 110 for purposes explained below.

Positioned in the solder container 116 is a solder pump 118, driven by a pulley operated shaft 118a. The pump feeds a pipe 119 communicating with an enclosed solder supply area 120 defined by a floor 121, supporting the manifolds 45 and 46, and a lower floor 122 heated, as stated above, by externally clamped resistance heaters (not shown).

Figure 3:
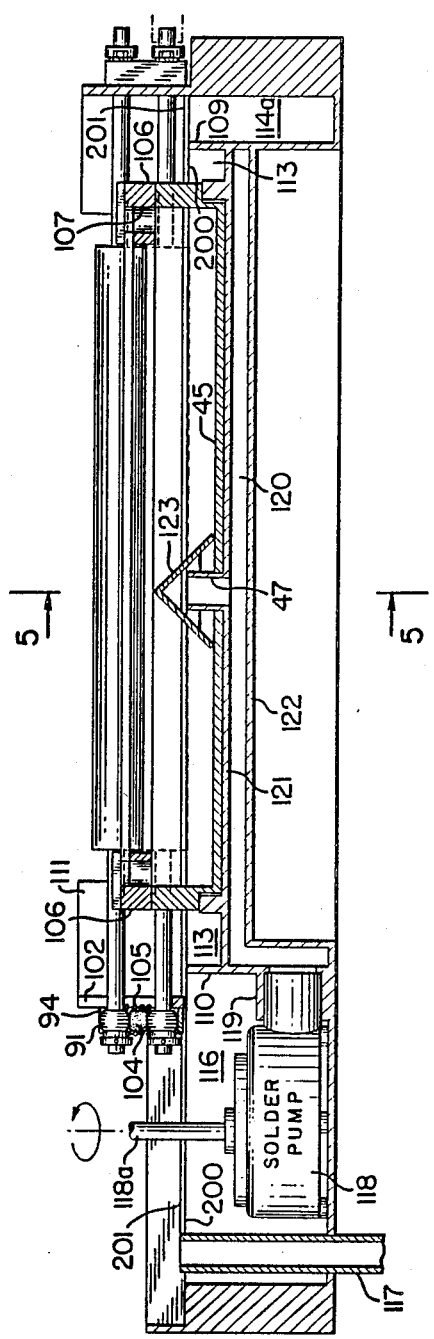
FIG. 3 shows a cross-section of the solder station taken along the view line 3—3 of FIG. 2 with the solder level shown at hot idle.

Initially solder 200 covered with an oil blanket 201 fills the sump 116, constant level skim section 113, the return passages 114a, 114b and 114c and the manifolds 45 and 46 to a level shown by the oil line 201 in FIG. 3. Thus all of the molten solder is covered by the oil while the system is at hot idle, i.e., the solder is molten and the rolls are turning but the pump is off. The oil 201 floats on all of the molten solder to prevent exposure to air and oxidation, to transfer heat to the rolls 42–44, and to combine with and aid in the removal of oxides and other dross formed during the soldering process. The oil can be polyalkylene glycol since it has a flash point of at least 600° F., good lubricity characteristics, and functions satisfactorily as a heat transfer medium between the solder and the lower rolls 42–44. It also has the advantage of being water soluble.

The level of the hot oil 201 at the top of the overflow results in the lower rolls 42, 43 and 44 dipping into the oil as they rotate. This enables the transfer of hot oil from the lower rolls to the upper rolls much like a roller coater, and maintains a constantly renewed layer of hot oil on the upper rolls. Thus the oil acts as a heat transfer medium to the rolls to maintain them at an elevated temperature.

When a suitable control switch is closed to initiate operation of the pump 118, panels 15 can then be fed to the preheater 10. Since the conveyer 21 transports the panels at a rapid speed, for example 6 inches per second, heating of the panels must occur quickly and efficiently not only at the panel surface, but throughout its thickness. It has been found that to provide such heating of printed circuit panels, which include plastics, glass and copper, the predominant wavelength of the infrared radiation must be on the order of $3\frac{1}{2}$ microns. Shorter wavelengths heat the copper excessively, leading to charring and a large temperature gradient across the panels. Wavelengths on the order of $3\frac{1}{2}$ microns are absorbed by the plastics in the panels and thus heat the panels more effectively.

When exiting the preheater 10, the panel surfaces have been heated to a temperature of 250° to 300° F. and the panel interiors to about 200° to 250° F. These temperatures are adequate to provide soldered boards with no blocked holes.

The heated panels 15 pass through and are thoroughly coated by the fluxer 11. A thin flux with a high flash point is used. The acid in the flux must remove recently formed oxides from the copper in less then one second. The volatiles in the flux must boil off rapidly to permit solder coating activity in one second. Further, the flux must have sufficient lubricity to prevent the solder from sticking to the resins in the printed circuit boards. Finally, the flux includes oil to replenish the oil blanket on the molten solder.

For example, the flux may be composed of polyalkylene glycol, 65%, a volatile component such as alcohol, 32%, and hydrochloric acid, 3%. The volatile component must have a low boiling point so that it vaporize rapidly at the temperature of the solder immersion chambers 82 and 83. This provides a boiling action at the panel surfaces causing rapid removal of the flux to permit soldering action to take place. Note that the hydrochloric acid removes recently formed oxide on the copper. It does not, however, perform the thorough cleaning of the panels required prior to processing in the soldering system.

The panels 15 are conveyed from the fluxer 11 and break a light beam provided between diagrammatically shown fiber optics 210 and 211 (FIG. 5) coupled by cables 212 and 213 to an air knives timer 214. When the leading edge of one of the panels 15 interrupts the light beam, the timer 214 initiates, after a short delay, air supply in a hose 61a to supply heated air via the compressed air heater 61 to the air knives 56 and 57. Normally, the timer delays the air supply two seconds to save energy while the panel passes through the soldering station 12 to the air knives 56 and 57. Since there are small holes in certain panels to be processed, the timer circuits are set so that there must be a gap of at least one inch to be recognized by the circuit.

For example, after the leading edge of the board passes the fiber optics light beam, there is a two second delay which permits the board to be conveyed towards the air knives 56 and 57, and then the air is turned on for a period of five seconds to level the soldered board. In this manner high pressure heated air, hence energy, is conserved. Of course, the delay period and the interval the air is supplied to the knives are both fully adjustable to compensate for different sized panels and different conveying speeds. Moreover, if the panels are spaced closely, the five second operation period is not affected by a following panel breaking the light beam.

The circuit boards, heated and fluxed, are properly aligned by guide 81 and then carried by the rolls 41 into the soldering station 12 and delivered to the rolls 42. At the time the system is activated for processing the circuit panels 15, the solder pump 118 has been switched on to flow solder through the pipe 119 and flow area 120 to the pipes 47 and 48. This floods the manifolds 45 and 46 with distributing caps 123 and 124 on the outlets of the pipes 47 and 48 directing solder flow in both directions. The solder fills the solder immersion chambers 82 and 83 by passing between the lower guides 53a-53b and 55a-55b. Solder also flows upwardly through the openings 107 in the vertical manifolds 106 and overflows between the retaining walls 108 to the upper surfaces of the upper guides when necessary and overflows to the constant level skim section 113. Note that the overflow level of the vertical manifolds 106 is above the chambers 82 and 83 and any panels passing through. Thus the flow through the passages 107 bypasses the panels and insures that the solder immersion chambers remain full during operation of the soldering system.

It is apparent from the foregoing and the drawings that the solder immersion chambers are defined by the lower retainers or guides, the upper retainers, the vertical manifolds and the rolls. Leakage from the chambers 82 and 83 between the lower guides 53 and 55 and the rolls 42–44 is minimized by adjusting the guides through the use of the slots 110 to space the lips 53c and 55c closely to the rolls. Further leakage occurs at the nips between the slightly tapered rolls 42–44, which increases when panels enter their nips. The increased solder leakage results in an increase in solder flow from the solder above the upper guides downwardly into the solder chambers to maintain the solder immersion chambers full. Thus the upper surfaces of wide panels are effectively immersed in and coated by solder.

Note that there is clearance for solder between the nip line of the rolls 42–44 along which the panels travel, and the upper surface of the lower guides 53 and 55. A greater clearance for solder is provided between the nip line and the lower surface of the upper guides 52 and 54 to insure immersion of thicker panels as they pass through the chambers. As indicated, the upper rolls move vertically and ride over the panels being processed.

The configuration of the manifolds 45 and 46 and the flow paths into the chambers 82 and 83, as shown, provide for laminar solder flow with no turbulence in the chambers. This affords effective solder coating of the panels 15 conveyed through the chambers.

In an exemplary embodiment, the distance between the rolls 42 and 43, and 43 and 44, is 6 inches to permit conveyance of small panels. To provide a minimum of two seconds of solder immersion, at a speed of 6 inches per second, two solder chambers are provided. It has been found that two seconds of immersion is the optimum for providing a solder coating with the most desirable characteristics. Longer and shorter times of immersion do not provide as desirable a solder coating.

The distribution of solder by the manifolds 45 and 46 is well beyond the width of the immersion chambers 82 and 83 to enable solder to flow up and over the panels even when wide circuit panels are passing through. Thus the bypass flow path for solder from the manifolds 45 and 46 through the vertical manifolds 106 insures maintenance of the solder level in the chambers 82 and 83 and coating of the upper surfaces of the panels.

Initially with a full load of solder in the sump 116 and at hot idle (pump 118 not operating), an oil coating on the order of five-eighths inch deep in the sump and return is provided on the solder, with the oil level at the top of the overflow pipe 117. The oil level on the solder in the constant level skim section 113 is one-quarter inch deep, a constant level at hot idle determined by the heights of the overflow tube and the walls 109 and 110. Over a period of operation, solder will be used and base oil added from flux washed from the panels in the immersion chambers 82 and 83. Thus the oil coating will increase in thickness in the sump and return sections, but not, of course, in the skim section.

Suitable covers, not shown in the interests of clarity, are also used to enclose the various solder containing portions of the system to retain heat and minimize air flow.

Figure 4:
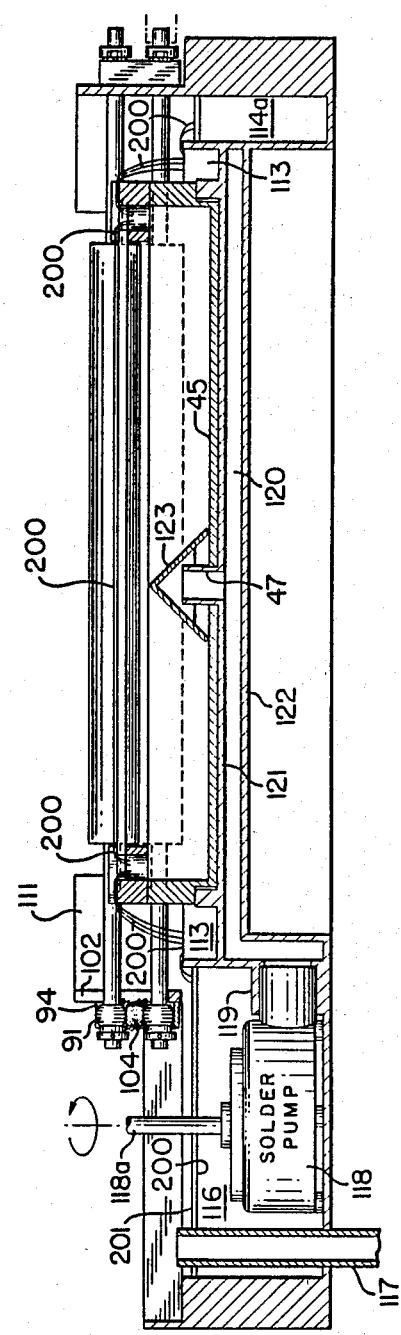
FIG. 4 shows a cross-section of the solder station similar to that of FIG. 3 except that the solder level is shown with the solder pump operating.
Figure 5:
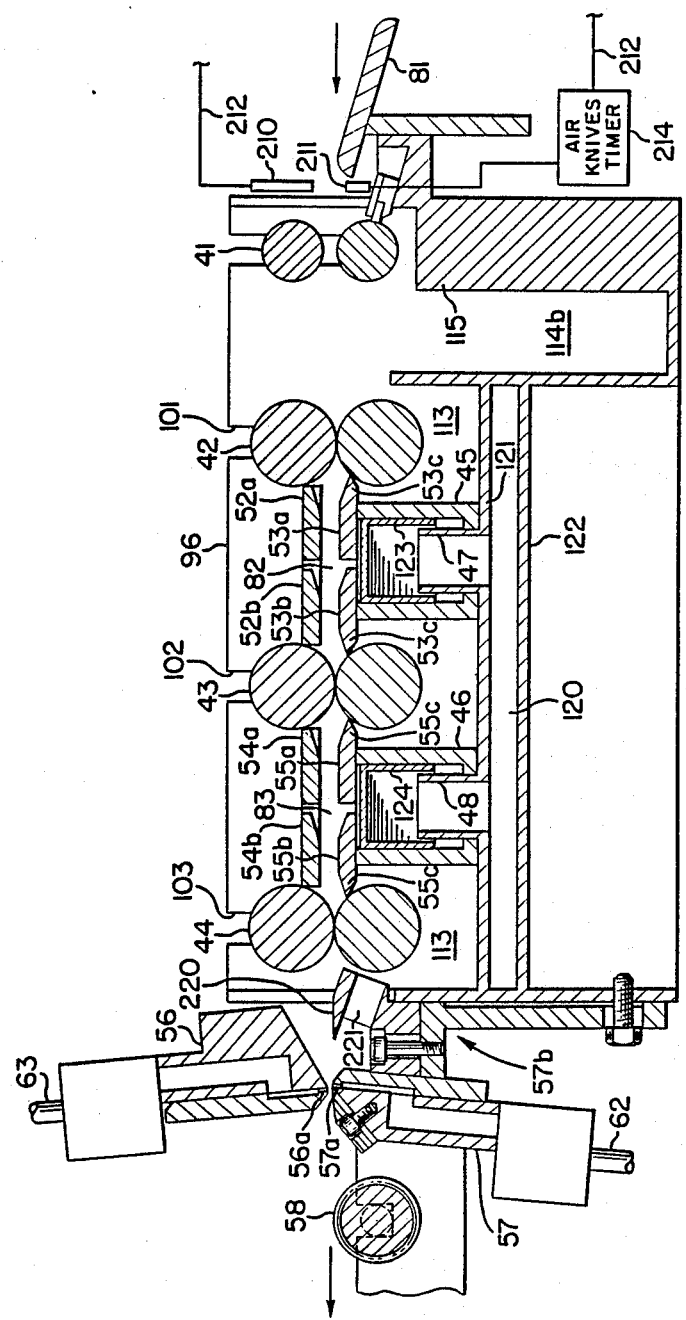
FIG. 5 is a cross-section of the solder and leveling stations taken along the view line 5—5 of FIG. 3.

Examining the solder flow and solder levels in greater detail, note that the level of the solder and oil blanket at hot idle were described above. Upon operation of the pump 118, the solder level in the sump 116 and return paths 114a, 114b and 114c is lowered by the filling of the manifolds 45 and 46 and the solder chambers 82 and 83. As above noted, prior to this action, all of the solder was covered with the protective oil blanket 201 as shown in FIG. 3. However, with the pump operating, the solder and oil levels in the sump and returns are initially as shown in FIG. 4. This is a third level of solder in the operating system. Note that solder overflows from the openings 107 in the vertical manifolds 106 to the skim section 113, as shown in FIG. 4, and then to the return channels 114 at both ends of the rolls. This results in a surface solder flow in the skim section parallel to the rolls and manifolds. The surface flow of solder in the constant level skim section skims the oil blanket and exposes the solder surface. The dross that is formed is also skimmed and carried to the sump 116 where it combines with the oil to form a compound that is more fluid than dross, facilitating its disposal by overflow through the overflow pipe 117.

As the system continues to operate, the thickness of the oil blanket increases in the sump and return channels, due to the addition of flux oil, until its level 201 reaches the overflow 117. Impurities in the oil then flow out of the sump 116 through the overflow 117. The solder level also falls as solder is used, but not as rapidly as the oil level rises, so that the oil layer can eventually become quite thick, on the order of a couple of inches. Note also that solder blown from the panels 15 by the air knives 56 and 57 is returned to the system to assist in maintaining the solder level.

During pump operation, the flow of solder over the weir-like walls 109 and 110 of the skim section provides a higher constant level of solder in the skim section. The higher constant level is above the level of the overflow pipe 117, so that oil cannot overflow into the skim section from the pump and return channels during soldering coating operation.

Solder is added to the sump when necessary. Of course when the pump 118 ceases operation, the solder in the immersion chambers 82 and 83 will leak out to raise the level in the return channels and sump, resulting in a substantial overflow of oil and impurities. With the inventive system, panels can be soldered over extended periods without the need for shut downs for cleaning maintenance.

As one of the soldered panels 15 exits from the immersion chamber 83, it is guided by a bar 220 (FIG. 5), supported by webs 221 adjacent to the nip of the rolls 44 and mounted over the coat section 113, to the air knives 56 and 57. Just prior to arrival of the panel 15, the air knives timer causes heated compressed air to be supplied through hoses 62 and 63 to the air knives. A lower elongated nozzle 57a, slightly tilted as shown, is slightly ahead of an upper tilted nozzle 56a.

The lower air knife 57 is mounted by a suitable bracket assembly 57b to the solder station wall. The upper air knife 56 is mounted by a bracket assembly (not shown in FIG. 5) on the solder station that enables it to be adjusted vertically and pivoted upwardly by handles 56b (FIG. 2) to provide access to the leveler knives. There is no need to adjust the lower knife 57. However, to accommodate panels of varying thicknesses, vertical adjustment of the upper knife 56 is necessary and provided by a suitable mounting arrangement (not shown).

Since the air knives are so close to the immersion chamber 83, leveling is initiated less than one-half second after the panel exits the molten solder. The solder is blown off from the panel surfaces and the holes toward the rolls 44 and the coat section 113. Note that suitable shields (not shown) prevent upward escape of solder. With this arrangement the holes are effectively cleared and no "puddling" of solder is found on the lower board surfaces.

The soldered and leveled panels are then conveyed through the cooler 14, as described above, and transported out of the soldering system as finished soldered printed circuits. The pump is switched off a predetermined time after the last panel has been conveyed through the soldering system.

While the invention has been described in connection with a specific embodiment, it will be understood that modifications may be made by those skilled in the art and that the invention is defined by the appended claims.

I claim:

1. A apparatus for soldering printed circuit panels comprising a plurality of stations through which the printed circuit panels are horizontally conveyed, the stations including a preheat station having heating means and rolls for conveying the panels through the preheat station to elevate the temperature of the panels, a flux station for coating the panels with a flux and including rolls for conveying the panels through the flux station, a soldering station including at least one solder immersion chamber defined by upper and lower retainer guide means and two pairs of rolls, the rolls functioning to convey printed circuit panels horizontally through the chamber, each roll pair including an upper roll and a lower roll, the guide means being parallel to the rolls and the lower guide means positioned close to the lower rolls to minimize solder leakage, means adjacent the ends of the pairs of rolls for further enclosing the solder chamber, an opening in the lower guide means parallel to the rolls, a manifold parallel to and below the solder chamber and communicating with the opening in the lower guide means, means for pumping solder into the manifold to flood the solder chamber through said opening, means providing a solder flow path that flows solder around wide panels in the chamber to maintain the chamber full, whereby printed circuit panels conveyed by the rolls through the solder chamber are quickly and efficiently soldered, a solder leveling station at the exit of the solder immersion chamber including upper and lower air knives to level the molten solder and open holes in the panels by removing excess solder, a cooling station including means for conveying the soldered panels from the solder leveling station to the cooling station, an air transport table in the cooling station including a perforated surface, and means for flowing cooling air through the perforations to convey and support the panel on a cushion of air thereby cooling the panel.

2. A apparatus as defined in claim 1, wherein the preheat station comprises an infrared heater providing radiation at a predominant wavelength on the order of 3.5 microns to the panels.

3. A apparatus as defined in claim 1, wherein the soldering station includes two solder immersion chambers.

4. A apparatus as defined in claim 1, wherein the air knives blow the excess solder on the panels into the soldering station to recycle the solder for use in soldering the conveyed panels.

5. A apparatus as defined in claim 1, in which timer means are provided between the flux station and the soldering station, said timer means being responsive to the passage of one of the panels to control a supply of heated compressed air to the air knives for leveling the soldered panel.

6. A apparatus as defined in claim 1, wherein the conveying means for the soldered panels exiting from the soldering station comprises rolls tapering toward their center to minimize contract of the hot soldered panels with the rolls.

7. A apparatus as defined in claim 1, in which the cooling station also includes means for providing a flow of cooling air to cool the upper surfaces of the panels.

* * * * *